(12) United States Patent
Quan et al.

(10) Patent No.: US 8,564,346 B2
(45) Date of Patent: Oct. 22, 2013

(54) NON-OVERLAPPING CLOCK GENERATION

(75) Inventors: Xiaohong Quan, San Diego, CA (US);
Tongyu Song, San Diego, CA (US);
Lennart Mathe, San Diego, CA (US);
Dinesh J. Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/356,187

(22) Filed: Jan. 23, 2012

(65) Prior Publication Data

US 2012/0161837 A1 Jun. 28, 2012

Related U.S. Application Data

(62) Division of application No. 12/417,497, filed on Apr. 2, 2009, now Pat. No. 8,169,243.

(51) Int. Cl.
*H03L 7/06* (2006.01)

(52) U.S. Cl.
USPC .......................................... 327/158; 327/149

(58) Field of Classification Search
USPC .................................................. 327/149, 158
See application file for complete search history.

(56) References Cited

U.S. PATENT DOCUMENTS

| 5,541,602 | A | 7/1996 | Opris et al. | |
|---|---|---|---|---|
| 5,719,514 | A * | 2/1998 | Sato | 327/262 |
| 7,088,275 | B2 * | 8/2006 | Waltari | 341/155 |
| 7,202,715 | B1 * | 4/2007 | Fan | 327/149 |
| 7,459,952 | B2 * | 12/2008 | Ogita | 327/239 |
| 7,466,177 | B2 * | 12/2008 | Huang et al. | 327/175 |
| 7,567,103 | B2 * | 7/2009 | Park et al. | 327/158 |
| 7,755,404 | B2 * | 7/2010 | Lin | 327/158 |
| 7,760,122 | B1 * | 7/2010 | Zortea | 341/155 |
| 7,839,192 | B1 * | 11/2010 | Wang | 327/175 |
| 7,952,409 | B2 * | 5/2011 | Yoshida | 327/239 |
| 2004/0080349 | A1 | 4/2004 | Kawahito et al. | |
| 2005/0110671 | A1 | 5/2005 | Lee et al. | |
| 2006/0251186 | A1 * | 11/2006 | Qian | 375/316 |
| 2010/0109725 | A1 * | 5/2010 | Yun et al. | 327/158 |
| 2010/0117702 | A1 * | 5/2010 | Jang et al. | 327/175 |
| 2010/0253405 | A1 * | 10/2010 | Quan et al. | 327/158 |
| 2011/0102033 | A1 * | 5/2011 | Pentakota | 327/157 |
| 2011/0102039 | A1 * | 5/2011 | Shin | 327/175 |
| 2012/0086485 | A1 * | 4/2012 | Trivedi et al. | 327/158 |

OTHER PUBLICATIONS

International Search Report and Written Opinion—PCT/US2010/029850—ISA/EPO—Jun. 22, 2010.

* cited by examiner

*Primary Examiner* — Adam Houston
(74) *Attorney, Agent, or Firm* — Kevin T. Cheatham

(57) ABSTRACT

Techniques for generating precise non-overlap time and clock phase delay time across a desired frequency range are provided. A non-overlapping clock generation circuit comprises a delay lock loop (DLL) circuit that generates a control voltage to a clock generator circuit coupled thereto. The control voltage operates to maintain precise timing relationship of non-overlapping delayed clock signals generated by the clock generator circuit. In one aspect, the DLL circuit receives an input clock with a known duty cycle and derives an output control voltage to fix the unit delay to a certain portion of the input clock cycle. The clock generator circuit may also include voltage-controlled delay cells that generate sets of clock signals delayed from one another by a non-overlapping time ($t_{nlp}$).

19 Claims, 8 Drawing Sheets

NON-OVERLAPPING CLOCK GENERATION

CLAIM OF PRIORITY UNDER 35 U.S.C. §120

The present application for patent is a Divisional of patent application Ser. No. 12/417,497, entitled "TECHNIQUES FOR NON-OVERLAPPING CLOCK GENERATION", pending and filed Apr. 2, 2009, and assigned to the assignee hereof and expressly incorporated by reference herein.

TECHNICAL FIELD

The present disclosure relates generally to the field of clock generation circuits, and more specifically to non-overlapping clock generation circuits.

BACKGROUND

In general, clock generation circuits are used to clock synchronous digital circuits, such as analog to digital converters (ADCs). A clock generation circuit provides a repetitive signal having a constant period. A clock signal has a first phase and a second phase within a single period of the clock signal. Typically, a clock generation circuit provides both an inverting and non-inverting clock signal. Clock generation circuits also commonly provide delayed clock signals.

One type of clock signal is a non-overlapping clock signal. Non-overlapping clock signals are commonly used in switched capacitor integrator circuits. A non-overlapping clock generation circuit provides a non-inverting clock signal and inverting clock signal that respectively transition before a delayed non-inverting clock signal and a delayed inverting clock signal. There is also a delay between transitions of the non-inverting clock signal and the inverting clock signal. In general, non-overlapping clock signals are used to reduce voltage error in switched capacitor circuits.

Conventional non-overlapping clock generator circuits are well known in the art and are commonly used to generate the required non-overlapping clock signals for switched capacitor integrator circuits that process signals in the audio frequency range.

In a switched-capacitor integrator utilized in high-speed analog-to-digital converters (ADCs), non-overlapping clocks are used. However, non-overlap time and clock phase delay time are generally implemented with inverter delays. The inverter delays vary over process, supply voltage and temperature. For example, inverter delays may vary over a factor of two when process, operating supply voltage, and operating temperature variations are taken into account. Process variations occur during the manufacture of integrated circuits (ICs).

The worst case conditions of process, operation voltage and temperature conditions are called slow and fast corner conditions. The non-overlap time requirements at a fast corner condition need to be satisfied which may yield two times the non-overlap time in a slow corner condition. The extra non-overlap time and phase delay time in a slow corner condition consumes the active time of the clock and requires faster settling of a switched capacitor integrator. Hence, there is more current consumption for an operational transconductance amplifier within the switch-capacitor integrator. Furthermore, as the switching-capacitor integrator sampling frequency (fs) increases, non-overlap time and phase delay becomes more significant relative to the active time of the clocking signal.

There is therefore a need for techniques for generating precise non-overlap time and clock phase delay time even at high switching-capacitor integrator sampling (Fs) frequencies.

SUMMARY

Techniques for generating precise non-overlap time and clock phase delay time across a desired frequency range are provided. In one configuration, a device includes a non-overlapping clock generation circuit which comprises a delay lock loop (DLL) circuit that in turn generates a control voltage to a clock generator circuit coupled thereto. The control voltage operates to maintain precise timing relationship of non-overlapping delayed clock signals generated by the clock generator circuit. In one aspect, the DLL circuit receives an input clock with a known duty cycle and derives an output control voltage to fix the unit delay to a certain portion of the input clock cycle. In a further aspect, the clock generator circuit includes a plurality of voltage-controlled delay cells coupled to the DLL circuit to generate a first set of clock signals and a second set of clock signals delayed from the first set of clock signals by a non-overlapping time ($t_{nlp}$) that is independent of manufacturing process variations.

Various other aspects and embodiments of the disclosure are described in further detail below.

The summary is neither intended nor should it be construed as being representative of the full extent and scope of the present disclosure, which these and additional aspects will become more readily apparent from the detailed description, particularly when taken together with the appended drawings.

Figure 1:
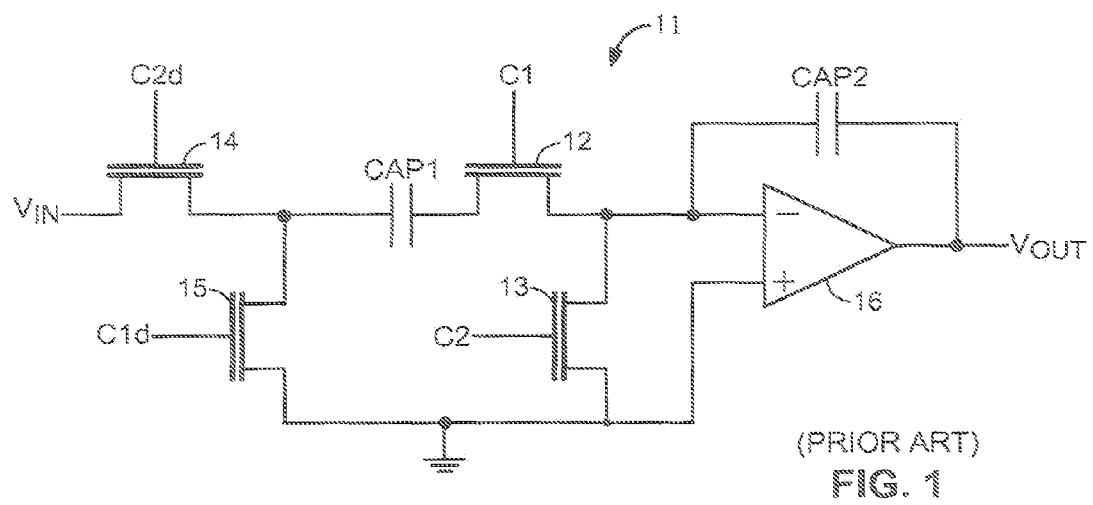
FIG. 1 is a schematic diagram of a switched capacitor integrator circuit.

To facilitate understanding, identical reference numerals have been used where possible, to designate identical elements that are common to the figures, except that suffixes may be added, when appropriate, to differentiate such elements. The images in the drawings are simplified for illustrative purposes and are not necessarily depicted to scale.

The appended drawings illustrate exemplary configurations of the disclosure and, as such, should not be considered as limiting the scope of the disclosure that may admit to other equally effective configurations. Correspondingly, it has been contemplated that features of some configurations may be beneficially incorporated in other configurations without further recitation.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Non-overlapping clock signals are typically used in switched capacitor circuits to minimize error. FIG. 1 is a schematic diagram of a prior art non-inverting switched capacitor integrator circuit 11 well known by one skilled in the art. Switched capacitor integrator circuit 11 comprises switches 12, 13, 14, and 15, capacitors CAP1 and CAP2, and amplifier 16. Switches 12, 13, 14, and 15 respectively receive non-overlapping clock signals C1, C2, C2$d$ (C2-delayed), and C1$d$ (C1-delayed).

In a first phase of operation, switches 13 and 14 are enabled to charge capacitor CAP1 to a voltage applied to an input Vin. Switch 14 connects the input Vin to a first terminal of capacitor CAP1. Switch 13 connects a second terminal of capacitor CAP1 to ground. Switches 12 and 15 are disabled to decouple capacitor CAP1 from amplifier 16 and capacitor CAP2. In a second phase of operation, switches 12 and 15 are enabled to couple capacitor CAP1 to amplifier 16 causing the charge stored on capacitor CAP1 to transfer to capacitor CAP2. Switch 15 couples the first terminal of capacitor C1 to ground. Switch 12 couples the second terminal of capacitor CAP1 to an inverting input of amplifier 16. A non-inverting input of amplifier 16 is coupled to ground. Capacitor CAP2 is connected from an output Vout to the inverting input of amplifier 16.

Figure 2:
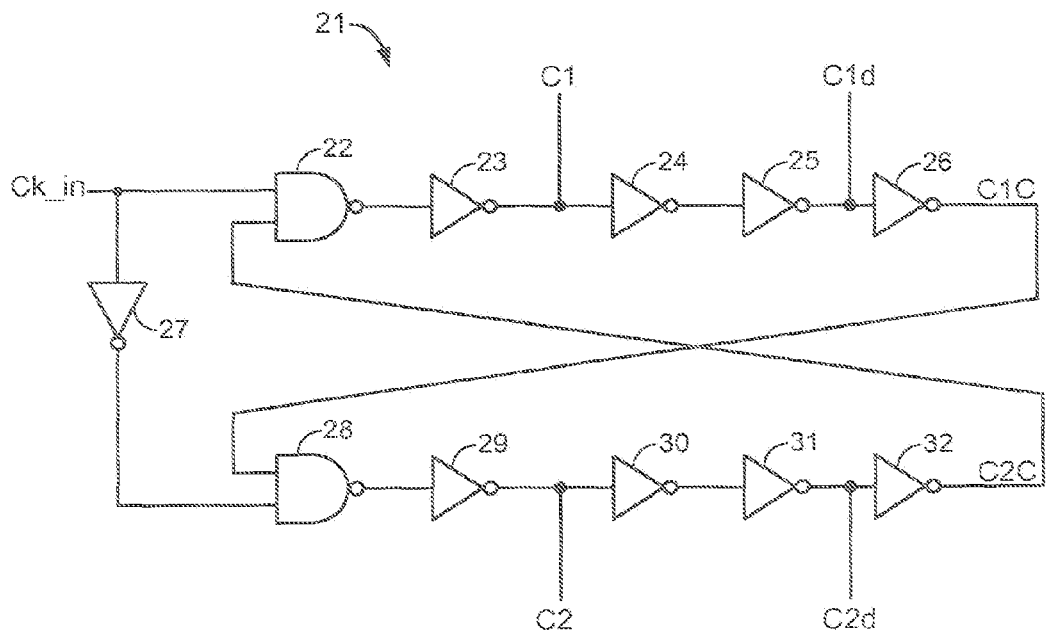
FIG. 2 is a schematic diagram of a prior art non-overlapping clock generation circuit.

FIG. 2 is a schematic diagram of a prior art non-overlapping clock generation circuit 21 for providing more than one non-overlapping delayed clock signal. Non-overlapping clock generation circuit 21 comprises NAND gates 22 and 28 and inverters 23, 24, 25, 26, 27, 29, 30, 31, and 32. A first delay line comprises NAND gate 22 and inverters 23-26. A second delay comprises NAND gate 28 and inverters 29-32. Clock signals C1, C1$d$, C2, and C2$d$ are respectively provided at the outputs of inverters 23, 25, 29, and 31. Clock signals C1C and C2C are respectively provided at the outputs of inverters 26 and 32 and are fed back to NAND gates 22 and 28. A clock signal (Ck_in) applied to a clock input of non-overlapping clock generation circuit 21 propagates sequentially through one of the delay lines and then the remaining delay line.

The delay line receiving a logic zero level from inverter 26 or inverter 32 (respectively clock signals C1C and C2C) is initially disabled from responding to a Ck_in signal transition. Alternately the NAND gate (NAND gates 22 or 28) that receives a Ck_in signal or inverted Ck_in signal that transitions from a 1-0 logic level is the first to propagate the Ck_in signal through their respective delay line.

For example, NAND gate 28 is armed for changing logic state when the Ck_in input=0, C1C=1, and C2C=0. The logic zero level of clock signal C2C (feedback signal) disables NAND gate 22 from changing logic state. As the clock signal transitions from 0-1, inverter 27 provides a 1-0 transition at the input of NAND gate 28. The clock signal propagates logic level changes through the second delay line ultimately producing a transition from 0-1 at the output of inverter 32 (C2C clock signal). Both inputs of NAND gate 22 are at a logic one level which generates a 1-0 transition at the output of NAND gate 22. The Ck_in signal now propagates through the first delay line (after the Ck_in signal has propagated through the second delay line). The sequential enabling of the two delay lines guarantees that the edges of clock signals C1, C1$d$, C2, and C2$d$ are provided at different times (non-overlapping).

Conversely, NAND gate 22 is armed for changing logic state when Ck_in input=1, C1C=0, and C2C=1. The logic zero level of clock signal C1C (feedback signal) disables NAND gate 28 from changing logic state. As the Ck_in signal transitions from 1-0 a transition of 0-1 is produced at the output of NAND gate 22. The Ck_in signal propagates through the first delay line causing C1C to transition from 0-1. Both inputs of NAN gate 28 are at a logic one level which generates a 1-0 transition at the output of NAND gate 28. The Ck_in signal now propagates through the second delay line (after the Ck_in signal has propagated through the first delay line) which ultimately generates a 1-0 transition at the output of inverter 32 (clock signal C2C).

Figure 3:
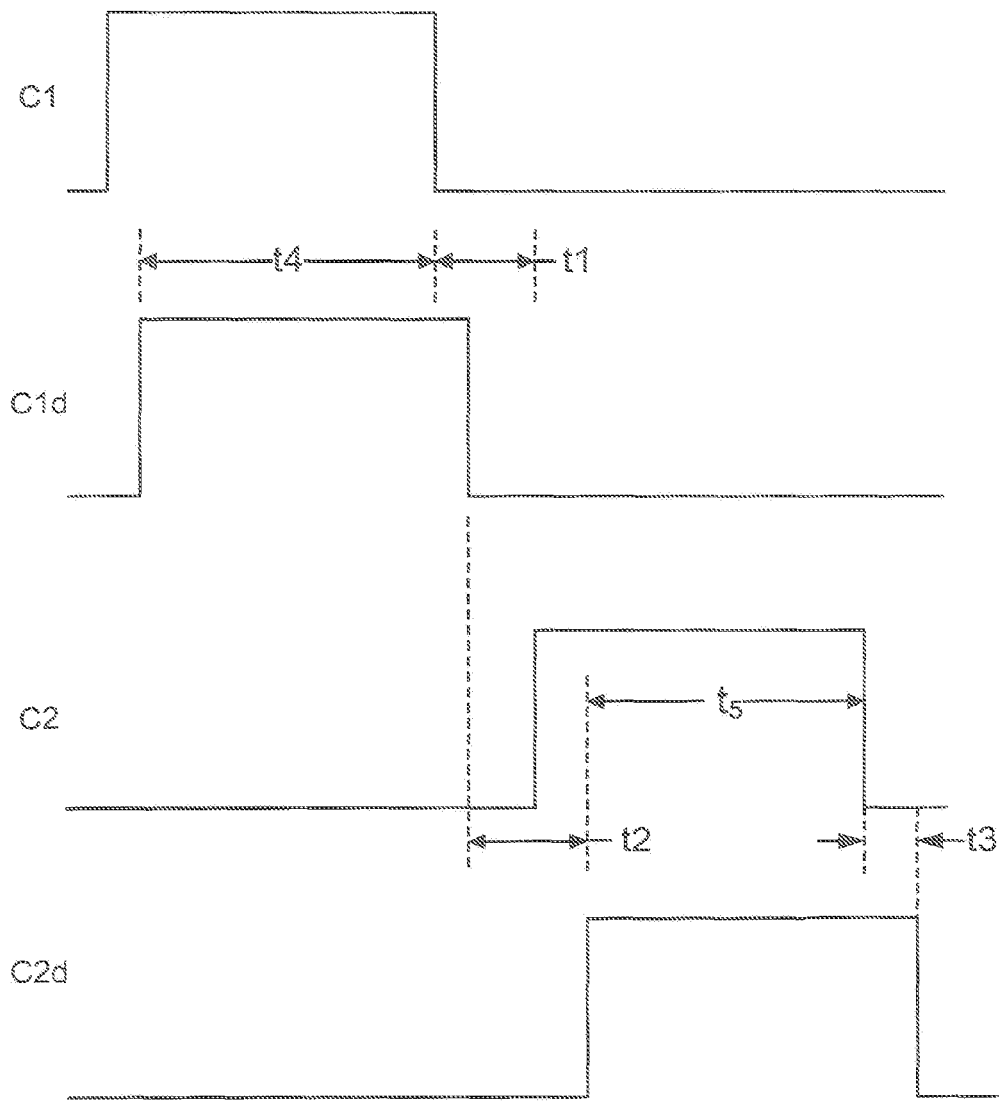
FIG. 3 is a timing diagram for the non-overlapping clock generation circuit of FIG. 2.

FIG. 3 is a timing diagram for the non-overlapping clock generation circuit 21 of FIG. 2. The timing diagram illustrates clock signals C1, C1$d$, C2, and C2$d$ and the delay associated with the generation of each clock signal.

A delay t1 is the delay (non-overlap time between phases of clock) between transitions of the clock signals C1 and C2. The delay of t1 corresponds to the delay through inverters 24, 25, 26, 29, and NAND gate 28. A delay t2 is the delay (non-overlap time between delayed phases of clock) between transitions of the clock signals C1$d$ and C2$d$. The delay corresponds to the delay through inverters 26, 29, 30, and 31, and NAND gate 28.

A delay t3 is the delay (delay time for delayed clocks) between transitions of the clock signals C1 and C1$d$ or C2 and C2$d$. The delay t3 for C1 and C1$d$ corresponds to the delay of inverters 24 and 25. Similarly, the t3 delay for C2 and C2$d$ corresponds to the delay of inverters 30 and 31.

In general, circuit operation of a switched capacitor network occurs within a time period t4. For example, referring to FIG. 1, in one phase of operation switched capacitor integrator circuit 11 of FIG. 1 capacitor CAP1 is coupled to amplifier 16 during the time period t4. Switched capacitor integrator circuit 11 must transfer the charge stored on capacitor CAP1 to capacitor CAP2, and settle to a stable voltage within the time period t4 otherwise error is introduced in the system.

Referring back to FIG. 3, the time period t4 does not begin until the clock signal C1$d$ transitions. The time period t4 ends when the clock signal C1 transitions from a logic one level to a logic zero level. A similar time period t5 is also associated when the clock signal C2 is at a logic one level. In this case, a time period t5 for the second phase of the clock cycle (C2) (another phase of operation) corresponds to the time available to charge capacitor CAP1 of switched capacitor integrator 11.

As mentioned previously, non-overlapping clock signals are used to clock switched capacitor circuits to reduce error. Sources of error prevented by non-overlapping clock generation circuit 21 of FIG. 2 are described by example, using a well known circuit such as switched capacitor integrator circuit 11 of FIG. 1. In a first case, C1$d$ and C2$d$ are non-overlapping.

An input voltage source applying an input voltage to the input Vin of FIG. 1 would be shorted to ground if switches 14 and 15 (FIG. 1) were simultaneously enabled. Delay t2 (FIG. 3) between clock signals C1d and C2d insures that switches 14 and 15 are never on at the same time.

In a second case, C1 and C2 are non-overlapping. The summing junction of amplifier 16 (FIG. 1) would be shorted to ground which would result in a loss of feedback around amplifier 16 if clock signals C1 and C2 (FIG. 3) are enabled simultaneously. Clock signals C1 and C2 respectively enable switches 12 and 13 (FIG. 1) of switched capacitor integrator circuit 11. Delay t1 (FIG. 3) between clock signals C1 and C2 insure that switches 12 and 13 are never on at the same time.

In a third case, the falling edge of C1d and C2d respectively transitions after the falling edge of C1 and C2. Delayed signals C1d and C2d reduce charge injection errors on a switched capacitor circuit. A delayed clock scheme is used to isolate charge injection to a single switch. In other words, by turning off a single switch first (the switch being coupled to a capacitor), other switches can be prevented from injecting charge onto the capacitor. For example, switch 12 is disabled by clock signal C1 while switch 15 is disabled by clock signal C1d. Turning off switch 12 before switch 15 decouples switched capacitor integrator circuit 11 from switch 15 thereby preventing switch 15 from injecting charge when turned off by delayed clock signal C1d.

Referring to FIG. 3, a problem occurs when using a non-overlapping clock generation circuit as shown in FIG. 2 at high clock frequencies. Delays that are purposely introduced to create non-overlapping clock signals significantly reduce the time (time period t4) in which a switched capacitor circuit has to operate. For example, assume a 20 Megahertz clock signal applied to the Ck_in input of non-overlapping clock generation circuit 21 of FIG. 2.

A standard 50 percent duty cycle Ck_in signal would have 25 nanoseconds for each phase of a Ck_in cycle. Time period t4, as provided by non-overlapping clock generation circuit 21, in which a switched capacitor circuit has to operate, is reduced from the provided Ck_in phase of 25 nanoseconds by approximately eight gate delays.

Referring to FIG. 3, the time period t4 begins when clock signal C1d transitions and ends when clock signal C1 transitions. Referring to FIG. 2, and assuming a 1 nanosecond delay per gate for this example, there are ten gate delays (inverters 23-25, 27, 29-32, and NAND gates 22 and 28) from a rising edge of a Ck_in signal applied to the Ck_in input to a transition of clock signal C1d, so that in the present example, time period t4 begins 10 nanoseconds after the initial transition of the Ck_in input signal.

Two gate delays (NAND gate 22 and inverter 23) subsequent to the next falling edge of the Ck_in input signal, clock signal C1 transitions so that time period t4 becomes the provided Ck_in signal of 25 nanoseconds minus 10 gate delays (10 nanoseconds from the Ck_in input signal rising edge to a clock signal C1d transition), plus two gate delays (2 nanoseconds from the Ck_in input signal falling edge to a clock signal C1 transition), such that t4=25 ns-10 ns+2 ns=17 ns. The reduction in the Ck_in phase due to the non-overlapping clock generation circuit 21 of the example is eight gate delays (8 nanoseconds) or 32 percent of the Ck_in phase.

Similarly, time period t5 of FIG. 3, as provided by non-overlapping clock generation circuit 21 (FIG. 2), in which a switched capacitor circuit has to operate, is reduced from the provided Ck_in phase of 25 nanoseconds by approximately 6 gate delays.

Referring to FIG. 3, the time period t5 begins when clock signal C2d transitions and ends when clock signal C2 transitions. Referring to FIG. 2, there are 9 gate delays (inverters 23-26 and 29-31, and NAND gates 22 and 28) from a falling edge of the Ck_in input signal to a transition of clock signal C2d, so that in the present example, time period t5 begins nine nanoseconds after the initial transition of the Ck_in input signal. Then three gate delays (NAND gate 22 and inverters 23 and 27) subsequent to the next rising edge of the Ck_in input signal, clock signal C2 transitions so that time period t5 becomes the provided Ck_in phase of 25 nanoseconds minus nine gate delays (nine nanoseconds from a Ck_in input signal falling edge to a clock signal C2 transition) which gives time period t5=25 ns-9 ns+3 ns=19 ns, which is a reduction of six gate delays (6 nanoseconds) or 24 percent of the Ck_in phase. Reducing the time period for a phase of a Ck_in signal limits the time period in which an operation of a circuit is performed. Using FIG. 1 as an example, this would correspond to operations such as charging capacitor CAP1 of switched capacitor integrator circuit 11 or transferring a charge stored on capacitor CAP1.

Figure 4:
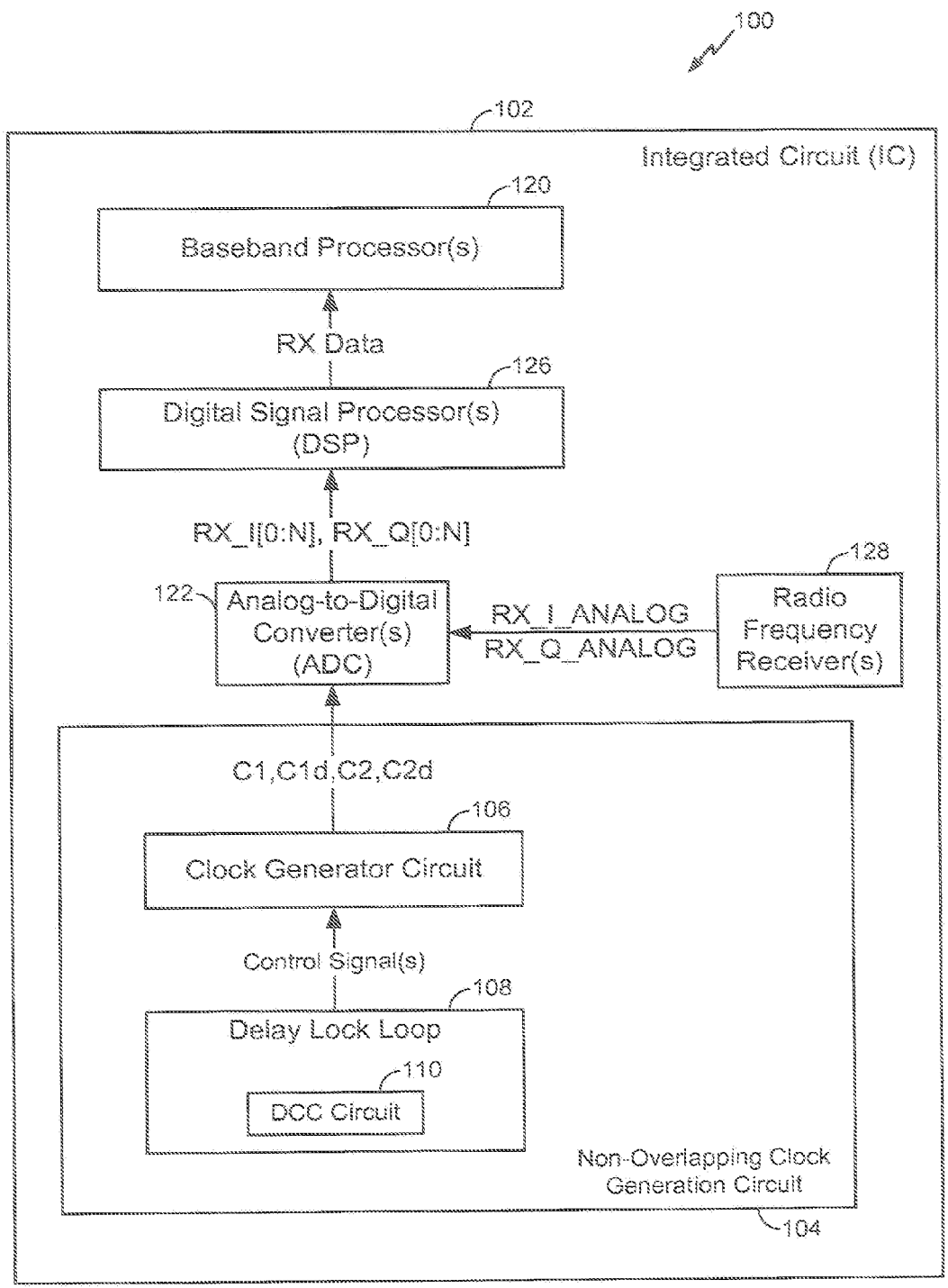
FIG. 4 is an example block diagram, in accordance with a present embodiment, of a device having a non-overlapping clock generation circuit including (i) a clock generator circuit for generating non-overlapping delayed clock signals, and a (ii) delay lock loop (DLL) circuit for generating one or more control clock voltages which operate to maintain precise timing relationship of the non-overlapping delayed clock signals.

FIG. 4 is an example block diagram, in accordance with a present embodiment, of a device having a non-overlapping clock generation circuit including (i) a clock generator circuit for generating non-overlapping delayed clock signals, and a (ii) delay lock loop (DLL) circuit for generating one or more control clock voltages which operate to maintain precise timing relationship of the non-overlapping delayed clock signals.

The implementation and operation of clock generator circuit 106 and delay lock loop (DLL) circuit 108 are explained below in greater detail in connection with FIG. 5 and FIG. 6, respectively. DLL circuit 108 further comprises a duty cycle control (DCC) circuit 110.

Device 100 may be an integrated circuit (IC). In one configuration, device 100 is a wireless communication device constructed on a single IC. It is a well known problem that during manufacturing, ICs are subject to various environmental and manufacturing conditions that could change operating parameters of the ICs.

In accordance with a present embodiment of the present invention, to minimize or eliminate differences in the operating parameters post-manufacturing, clock generator circuit 106 and DLL circuit 108 are interlinked to generate precise non-overlap time and clock phase delay times as a function of some input clock time Ck_in or Ts, which time is inversely proportional (1/Ts) to a corresponding desired frequency Fs (=1/Ts).

The precise non-overlap time and clock phase delay time comprise non-overlapping delayed clock signals C1, C1d, C2, and C2d, which signals are used to precisely clock high-speed analog to digital converter (ADC) 122.

In one aspect, ADC 122 may be implemented as a switched integrator capacitor with delayed clock signals C1, C1d, C2, and C2d output by non-overlapping clock circuit 104 of FIG. 4 interlinked to delayed clock inputs C1, C1d, C2, and C2d of switch capacitor 11 of FIG. 1.

In accordance with the present embodiment shown in FIG. 4, in addition to non-overlapping circuit 104 and one or more ADCs 122, device 100 may include one or more baseband processors 120, one or more digital signal processors (DSP) 126, and one or more radio-frequency (RF) receivers 128, all integrated on a single IC.

In one configuration, analog signal outputs (RX_I_ANALOG and RX_Q_ANALOG) from RF receiver 128 are sent to ADC 122 to convert baseband analog I/Q signals (RX_I_ANALOG and RX_Q_ANALOG) to digital signals (RX_I[0:N] and RX_Q[0:N]) for input to DSP 126. DSP 126 demodulates the digital I/Q signals into a data stream for further processing by baseband processor 120. It should be appreciated that wireless communication device IC 100 operates based on at least one frequency band for use in a wireless communication system.

Figure 5:
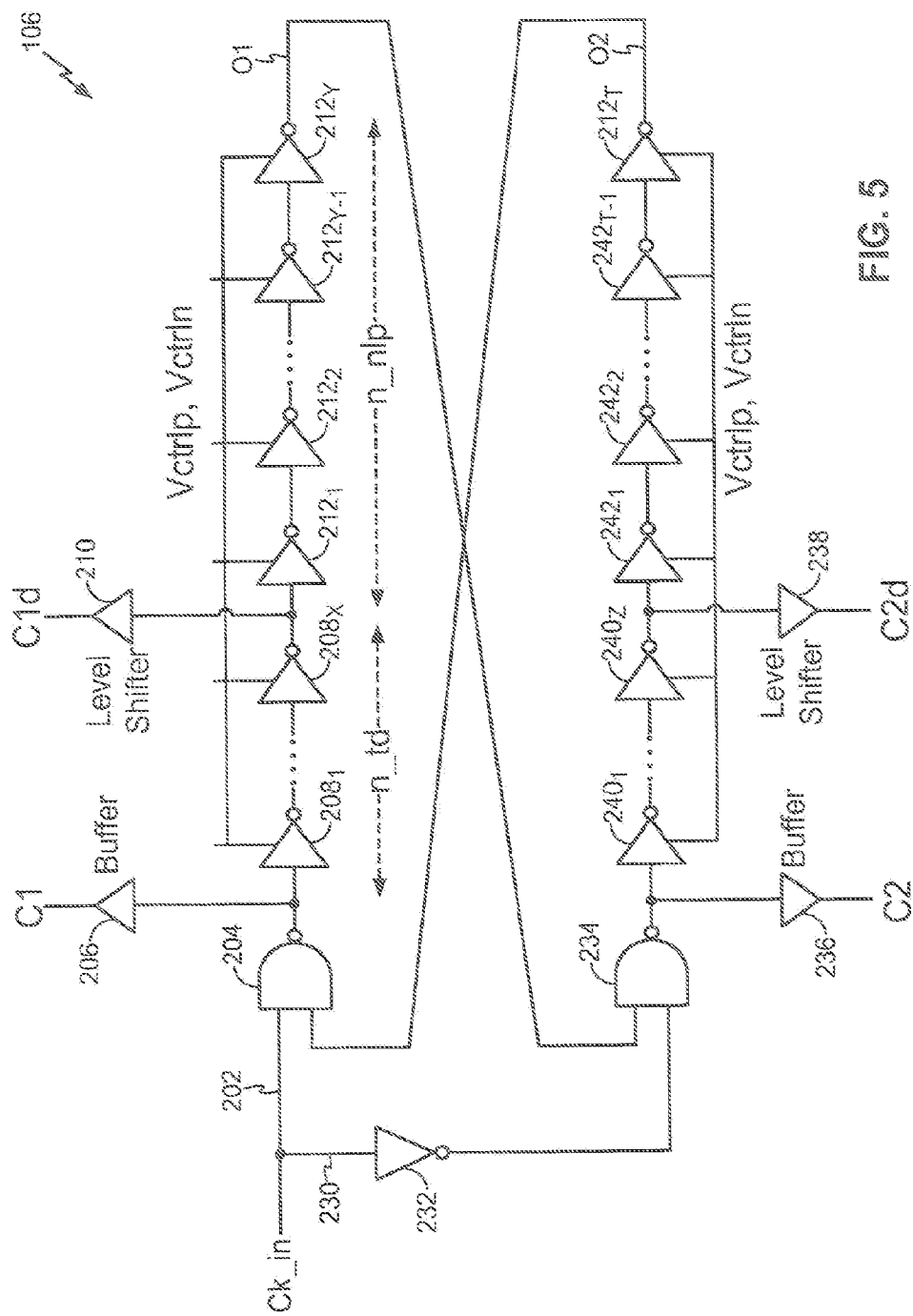
FIG. 5 is an example schematic diagram of the clock generator circuit of FIG. 4 implemented using voltage-controlled delay cells.

FIG. 5 is an example schematic diagram of the clock generator circuit in FIG. 4 implemented using voltage-controlled delay cells.

The clock generator circuit 106 includes an input to receive a clock (Ck_in) that is coupled to a first path 202 and a second path 230. The first path 202 includes a NAND gate 204 having a first input coupled to receive an input clock Ck_in and a second input to receive an output signal O2 of the second path 230. The output of the NAND gate 204 is configured through buffer 206 to produce a first clock output signal C1. The output of NAND gate 204 is coupled to a first set of two or more series-coupled inverter gates $208_1$-$208_X$. The output of inverter gate $208_X$ is configured by level shifter 210 to generate a clock signal denoted by C1$d$. The propagation delay for buffer 206 and level shifter 210 are typically matched. In one configuration, the number of inverters, denoted as n_td, is equal to two or more.

The output of the last inverter gate $208_X$ is also followed in series with a second set of one or more series-coupled inverter gates $212_1$, $212_2$, . . . , $212_{Y-1}$ and $212_Y$. The last inverter $212_Y$ of the second set produces an output signal O1 applied to an input of a NAND gate 234 of the second path 230. In one configuration, the number of inverter gates $212_1$, $212_2$, . . . $212_{Y-1}$ and $212_Y$, denoted as n_nlp, is equal to four.

The second path 230 includes an inverter gate 232 that receives an input clock signal, denoted as Ck_in. The inverter gate 232 is followed by a NAND gate 234 that receives as inputs the output of the inverter 232 and the output O1. The output of NAND gate 234 is configured by buffer 236 to produce a second clock signal C2. The output of NAND gate 234 is also coupled to a first set of series-coupled inverters $240_1$-$240_Z$. The last inverter $240_Z$ is configured by level shifter 238 to produce delayed clock signal C2$d$. The propagation delay for buffer 236 and level shifter 238 are typically matched. The last inverter $240_Z$ of the first set of series-coupled inverter gates $240_1$-$240_Z$ is coupled in series with a second set of series-coupled inverter gates $242_1$, $242_2$, . . . , $242_{T-1}$ and $242_T$. The output of a last inverter gate $242_T$ produces signal O2 which is looped back to one of the inputs of NAND gate 204 of the first path 202.

All of the inverter gates $208_1$-$208_X$, $212_1$, $212_2$, . . . , $212_{Y-1}$ and $212_Y$, $240_1$-$240_Z$ and $242_1$, $242_2$, . . . , $242_{T-1}$ and $242_T$ receive two control voltages, Vctrlp and Vctrln, produced by the DLL 108. Furthermore, the inverter gates are voltage-controlled delay cells controlled by the control voltages Vctrlp and Vctrln as will be shown in FIG. 7.

Figure 6:
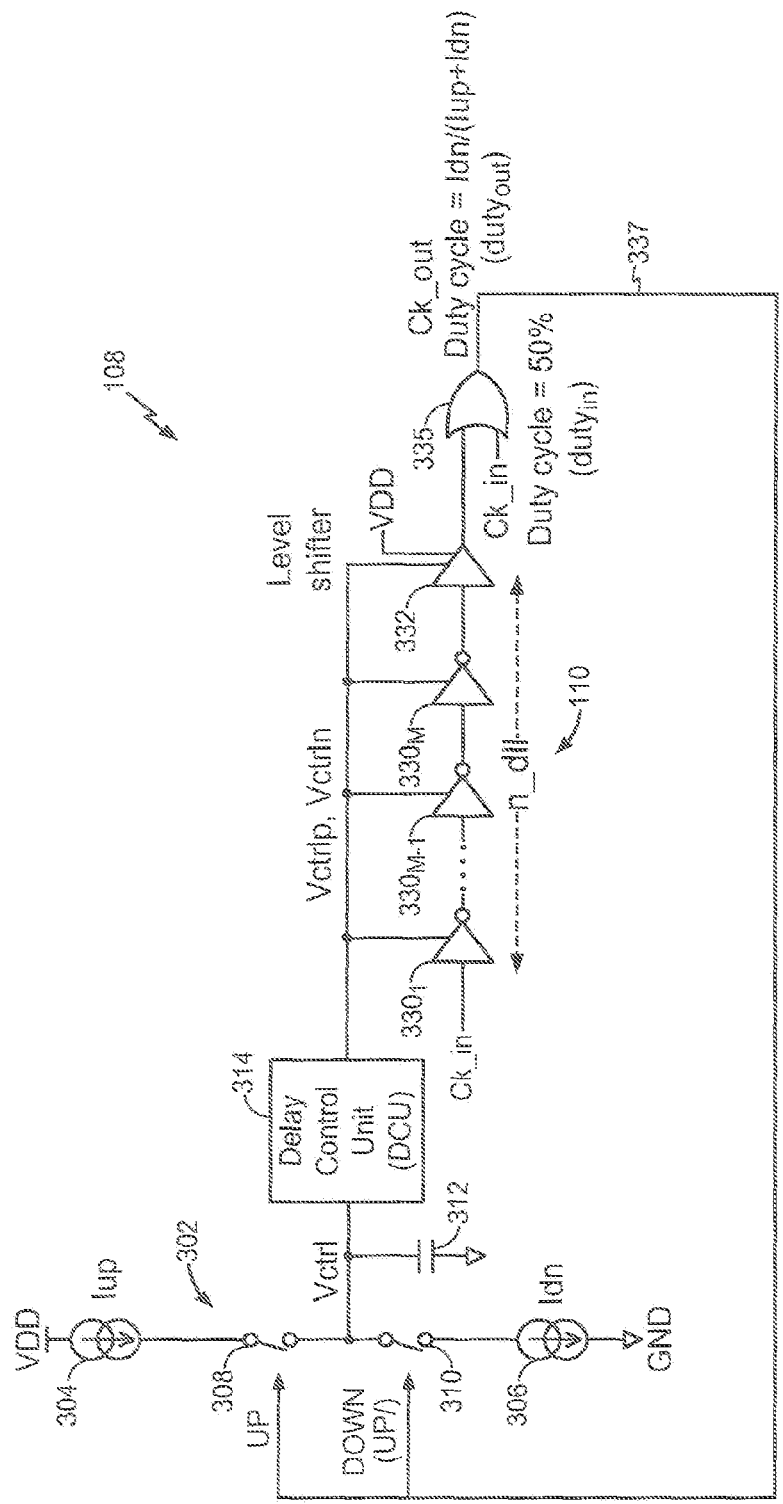
FIG. 6 is an example schematic diagram of the delay lock loop (DLL) circuit of FIG. 4 for generating control clock voltage(s) to the clock generator circuit of FIG. 5, shown also implemented using voltage-controlled delay cells.

FIG. 6 is an example schematic diagram of the delay lock loop (DLL) circuit 108 of FIG. 4 for generating the Vctrl signal to the clock generator of FIG. 5, also implemented using voltage-controlled delay cells.

DLL 108 includes charge pump 302 followed by charge capacitor 312. The filtered voltage on charge capacitor 312 is Vctrl. The charge pump 302 includes UP and DOWN (UP/) current sources 304 and 306 and switches 308 and 310. The switch 308, when closed, passes a current Iup to charge capacitor 312 in response to the UP pulse. Switch 310, when closed, passes a current Idn to the charge capacitor 312 in response to the DOWN (UP/) pulse. An output of the charge capacitor 312 is provided to the input of Delay Control Unit (DCU) 314. DCU 314 converts the Vctrl analog voltage into differential voltages Vctrlp and Vctrln. Vctrlp and Vctrln set the delay for all voltage-controlled inverter delay cells.

An output of OR gate 335 delivers the UP or DOWN (UP/) pulses to the charge pump 302, on line 337, so as to increase or decrease the control voltage Vctrl as measured on charge capacitor 312. The UP and DOWN (UP/) current sources 304 and 306 produce currents Iup and Idn respectively. The UP current source 304 is coupled to receive a voltage VDD while the DOWN (UP/) current source 306 is coupled to ground.

DCC circuit 110 includes a plurality of series-coupled inverters $330_1$ . . . $330_{M-1}$ and $330_M$ and level shifter 332. The plurality of series coupled inverters $330_1$-$330_M$ and level shifter 332 of DCC circuit 110 receive control voltages Vctrln and Vctrlp from the output of the Delay Control Unit (DCU) 114. The DCU 114 translates the Vctrl signal from a single-ended voltage (Vctrl) to a differential voltage set (Vctrlp and Vctrln). Vctrlp and Vctrln are varied between VDD and ground. Vctrlp and Vctrln are inputs to inverters $330_1$-$330_M$ and level shifter 332 to control the time delay of DCC circuit 110.

The sum of the plurality of inverters $330_1$-$330_M$ and level shifter 332 produce a clock delayed signal sent to the OR gate 335. The number of the plurality of inverters $330_1$, . . . , $330_{M-1}$ and $330_M$ and the level shifter 332 is denoted as n_dll where M is an index. A first inverter $330_1$ of the DCC circuit 110 receives as input Ck_in which is the same clock input as that of clock generator circuit 106. Level shifter 332 also receives a supply voltage VDD wherein the purpose of level shifter 332 is to restore a clock signal swing from between Vctrlp and Vctrln to VDD and ground.

The output of DCC circuit 110 is provided to OR gate 335 having a first input that receives the output of DCC circuit 110 and a second input corresponding to Ck_in with a 50% duty cycle. The output of the OR gate 335 loops back at line 337 to generate the UP and DOWN control input signals to the charge pump 302.

In the DCC circuit 110, an input clock with 50% duty cycle can be falling (or rising) edge delay-adjusted to extend active high (or active low) time to a desired duty cycle at the output of the OR gate 335, denoted as Ck_out. This is done with DLL 108 where voltage-controlled delay cells are used (the plurality of inverters $330_1$, . . . , $330_{M-1}$ and $330_M$). The M is an index and equals the number n_dll. A duty cycle (duty$_{out}$) from the OR gate 335 equals the ratio of Idn/(Iup+Idn).

In operation, the DLL 108 uses the DCC circuit 110 to adjust the (50%) duty cycle of the input clock Ck_in present at the OR gate 335 input to another value (for example 75%) at the output of OR gate 335 (Ck_out). Thus, the amount of the falling edge delay, extended by the DLL 108, is 25% of the time Ts. With the DCC circuit 110 using the same inverter voltage-controlled delay cells used in the clock generator circuit 106, the clock delays and non-overlap time can be controlled as a precise fraction of time Ts. In order to achieve a very small non-overlap time, (i.e., 200 ps) a ratio based on the number n_dll of voltage-controlled delay cells in the DLL 108 and the number n_td of voltage-controlled delay cells in the clock generator circuit 106 can be chosen to obtain the desired precision in non-overlap time.

The ratio between the number n_dll of voltage-controlled delay cells in the DLL 108 and the number n_td of voltage-controlled delay cells in the clock generator circuit 106 is calculated based on the following equations (1a) or (1b):

$$\frac{\text{n\_dll}}{\text{n\_td}} = \frac{Ts}{t_d} \cdot (duty_{out} - duty_{in}) \quad (1a)$$

or $$\frac{\text{n\_dll}}{\text{n\_nlp}} = \frac{Ts}{t_{nlp}} \cdot (duty_{out} - duty_{in}) \quad (1b)$$

where $t_d$ is the time between a falling edge of the clock signal C1 to a rising edge of delayed clock signal C1d (or between a falling edge of the clock signals C2 to a rising edge of delayed clock signal C2d); $t_{nlp}$ is a non-overlap time corresponding to the falling edge of clock signal C1d to the rising edge of clock signal C2; $duty_{in}$ is an input clock duty cycle to DCC circuit 110; $duty_{out}$ is an output clock duty cycle of the DCC circuit 110; n_td is the number of voltage-control delay cells in clock generator circuit 106 corresponding to the NOT gates $208_1$-$208_X$; n_nlp is a number of voltage-controlled delay cells in clock generator circuit 106 to produce the non-overlap time; n_dll is a number of voltage-controlled delay cells in DLL 108. Satisfying the ratio in equations (1a) or (1b) produces a non-overlap time and clock phase delay time based on a precise fraction of time Ts with DLL 108. The time Ts is equal to the sample clock for a high-speed analog-to-digital converter (ADC) and the duration of time from the rising edge of the clock signal C1 to the falling edge of delayed clock signal C2d must be less than or equal to Ts.

Figure 7:
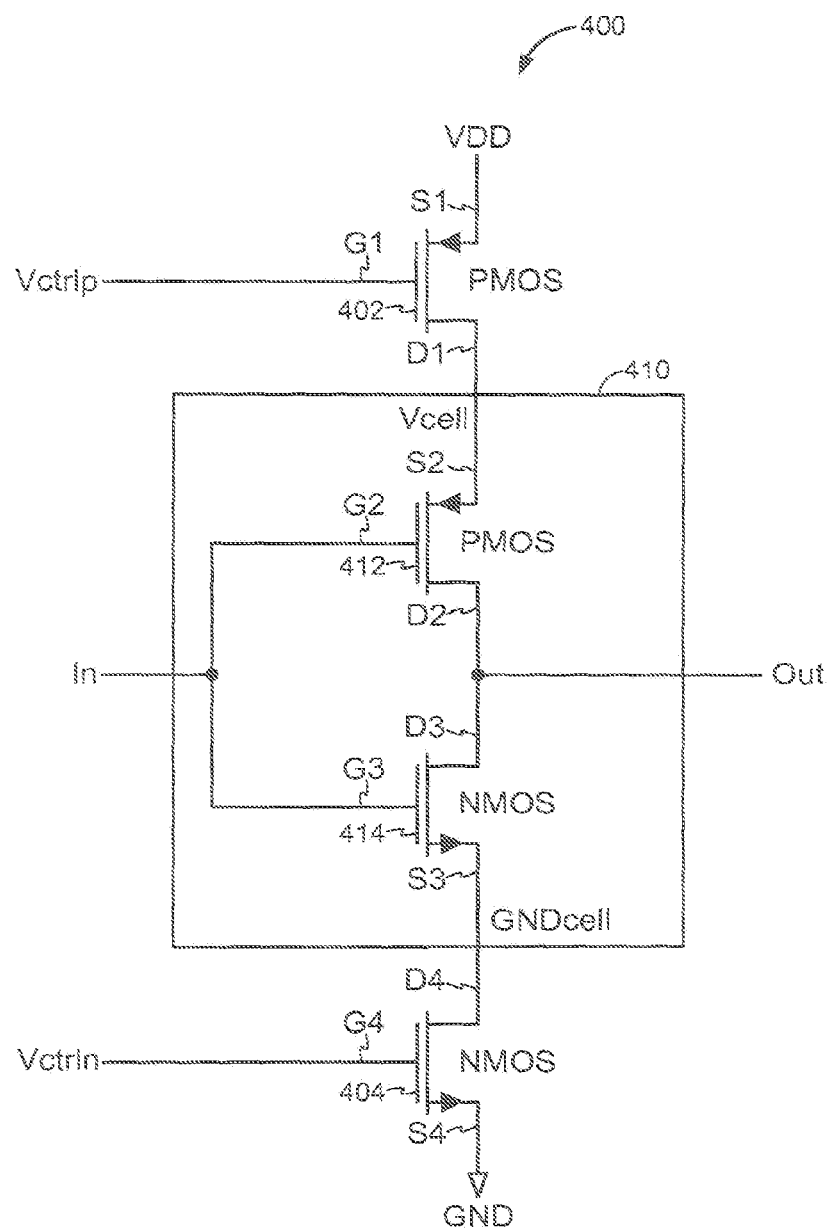
FIG. 7 is an example schematic diagram of a voltage controlled delay cell as used in the clock generator circuit 106 of FIG. 5 and the DLL circuit 108 of FIG. 6.

FIG. 7 shows an example schematic diagram of a voltage controlled delay cell 400 used in the clock generator circuit 106 of FIG. 5 and the DLL circuit 108 of FIG. 6. A CMOS inverter 410 is composed of PMOS 412 and PMOS 414 devices. The input to the CMOS inverter 410, In, is a logic signal, a clock signal with period Ts, with voltage swing determined by the source voltage swing. The output of the CMOS inverter 410, Out, is a logic signal, a clock signal with period Ts related to the input, In, by variable delay dependent on Vctrl, Vctrlp, and Vctrln.

The propagation delay of the CMOS inverter 410 with Vctrlp and Vctrln controlling PMOS device 402 and NMOS device 404 respectively. By adjusting Vctrlp within the linear region of PMOS 402, the internal voltage Vcell, is changed between VDD and Ground (GND). Likewise, by adjusting Vctrln within the linear region of NMOS 404, the internal voltage GNDcell, is changed between GND and VDD. As the internal voltages Vcell and GNDcell diverge from VDD and GND respectively, the CMOS inverter 410 output voltage swing decreases (Vcell–GNDcell) and propagation delay (delay from In to Out) increases.

The Delay Control Unit (DCU) from FIG. 3 generates Vctrlp and Vctrln from Vctrl. There are many possible circuit implementations for converting between single-ended and differential signals. In the example embodiment, Vctrlp is equal to –Vctrl and Vctrln is equal to Vctrl.

Figure 8:
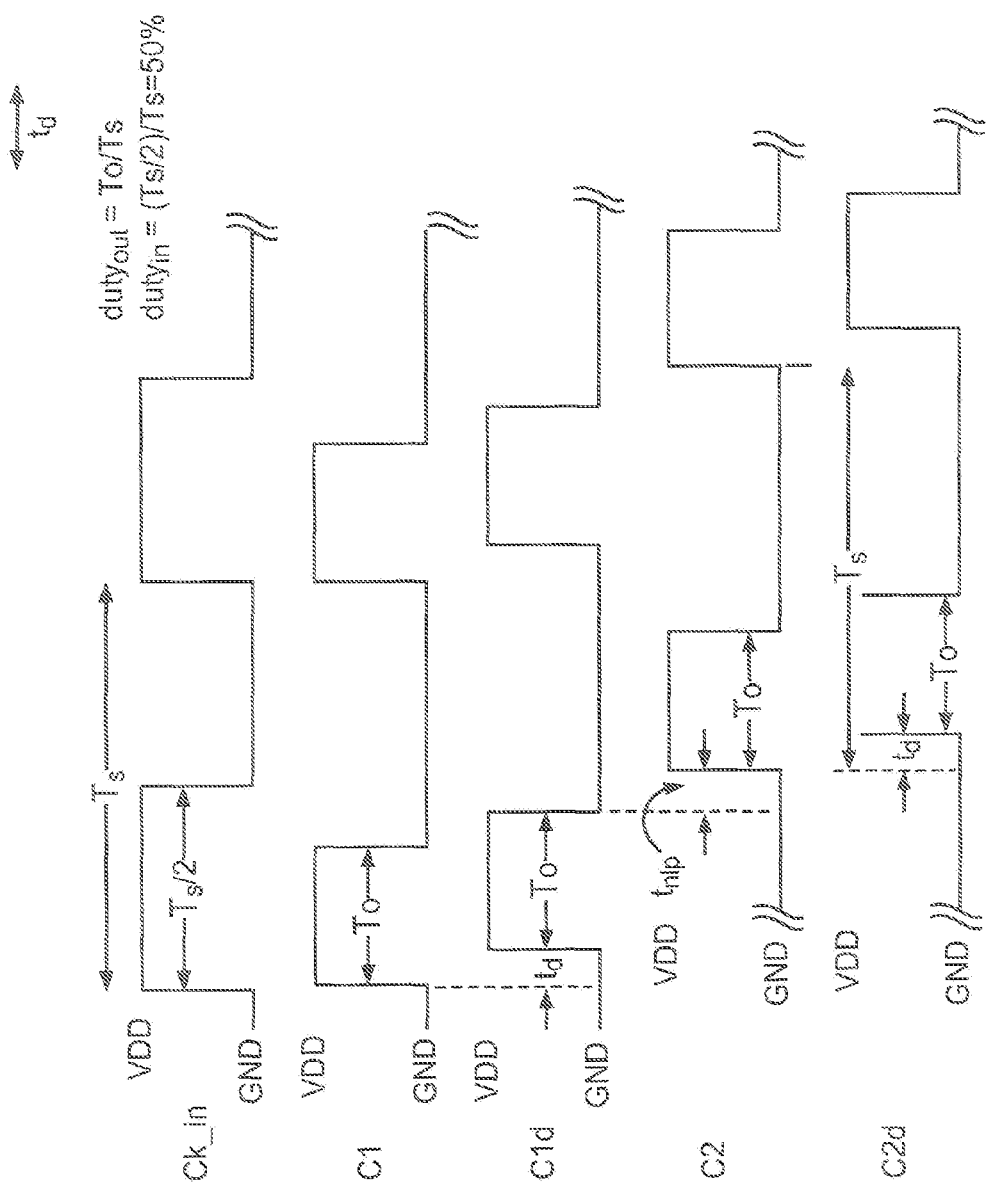
FIG. 8 is an example timing diagram showing the timing relationship, and particularly, non-overlapping time ($t_{nlp}$) relationship, of delayed clock signals from the clock generator circuit of FIG. 4 and FIG. 5.

FIG. 8 is an example timing diagram of the clock generator circuit of FIG. 4 and FIG. 5. The time $t_d$ is shown as the time between the clock signal C1 to delayed clock signal C1d or between the clock signals C2 to the delayed clock signal C2d. The time $t_{nlp}$ is the non-overlap time corresponding to the falling edge of the clock signal C1d to the rising edge of the clock signal C2. Each clock signal swings between two voltages, VDD and GND, and assumes that there are buffers for clock signals C1 and C2 as well as level shifters 210 and 238 for clock signals C1d and C2d respectively as shown in FIGS. 5 and 6. Duty cycle calculation is conducted by known methods in the art where FIG. 8 characterizes $duty_{out}$ as To/Ts. In a further example, $duty_{in}$ is shown to be 50%, but may be chosen from a plurality of values ranging from 0% to 100%.

In one example configuration for FIG. 5, the number n_td is equal to two (2) where 2 is a minimum number of inverter gates and n_nlp is equal to four (4). Thus, X corresponds to an index for the inverter gates $208_1$-$208_X$, X is also the number of inverters in the first set of two or more series-coupled inverter gates $208_1$-$208_X$, and X is further equal to n_td. Moreover, Y corresponds to an index for the inverter gates $212_1, 212_2, \ldots, 212_{Y-1}$ and $212_Y$, Y is also the number of inverters in the second set of one or more series-coupled inverter gates $212_1, 212_2, \ldots, 212_{Y-1}$ and $212_Y$, and Y is further equal to n_nlp.

In one configuration, Z corresponds to an index for the inverters $240_1$-$240_Z$ and is equal to n_td. Moreover, T corresponds to an index for the inverters $242_1, 242_2, \ldots, 242_{T-1}$ and $242_T$, and is equal to n_nlp.

Figure 9:
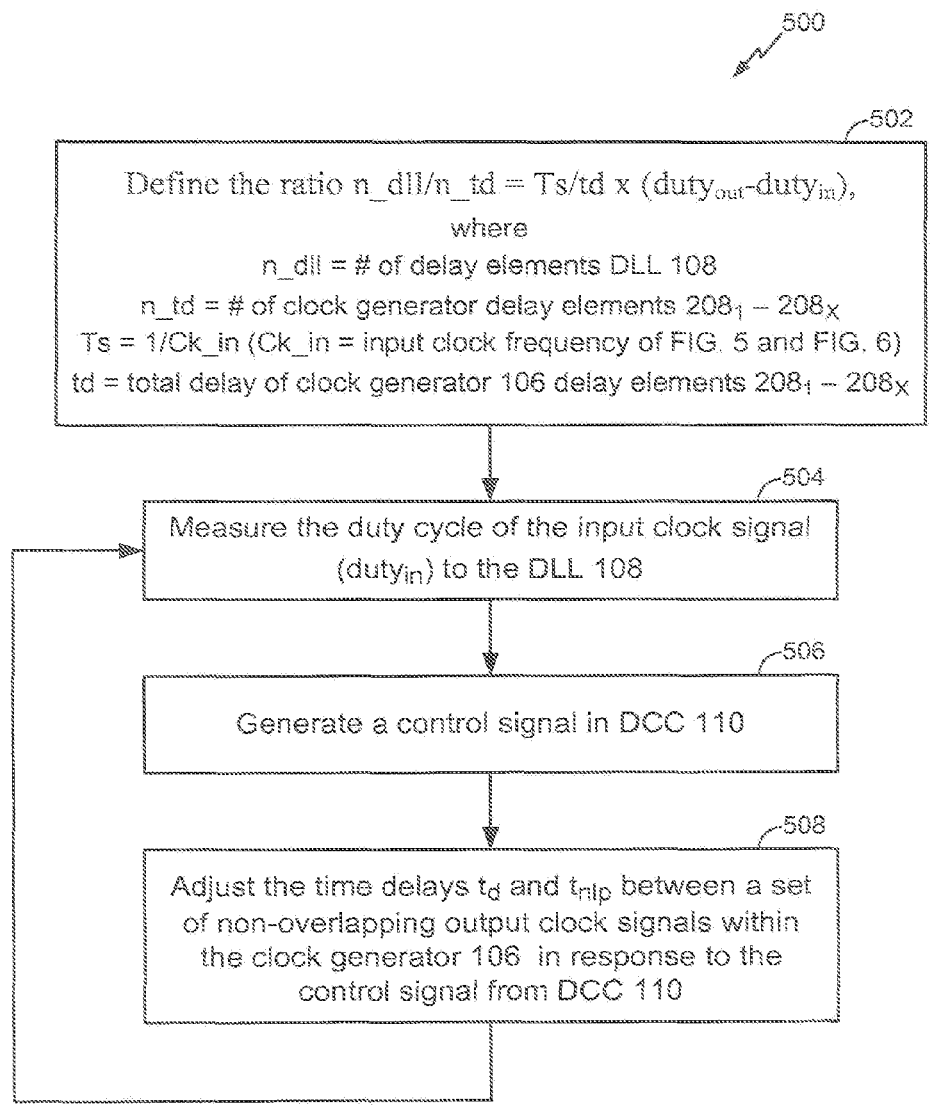
FIG. 9 is a flow diagram showing a method of adjusting the time delays $t_d$ and $t_{nlp}$ between a set of non-overlapping output clock signals within the clock generator 106.

FIG. 9 is a flow diagram showing a method of adjusting the time delays $t_d$ and $t_{nlp}$ between a set of non-overlapping output clock signals within the clock generator 106. In a first step 502 the ratio n_dll/n_td is defined as being equal to Ts/td x ($duty_{out}$-$duty_{in}$), where n_dll is equal to the number of delay elements in DLL 108 and n_td is equal to the number of clock generator delay elements of the inverter gates $208_1$ to $208_X$. $T_s$ is equal to 1/Ck_in, where Ck_in is equal to the input clock frequency of FIG. 5 and FIG. 6 and td is equal to the total delay of clock generator 106 delay elements of the inverter gates $208_1$ to $208_X$. Next, in second step 504 the duty cycle of the inpute clock signal ($duty_{in}$) to DLL 108 is measured. In third step 506, a control signal is generated in DCC 110. Finally, in last step 508, the time delays $t_d$ and $t_{nlp}$ are adjusted between a set of non-overlapping output clock signals within clock generator 106 in response to the control signal from DLL 110.

Table 1 below is an example of representative values for generating a desired $duty_{out}$ of 75% based on a $duty_{in}$ of 50% for a selected clock frequency at 100 MHz.

TABLE 1

| Parameter | Value(s) |
| --- | --- |
| Frequency (Fs) | 100 MHz |
| Period (Ts) | 10 ns |
| $duty_{in}$ | 50% |
| $duty_{out}$ | 75% |
| Targeted $t_d$ | 100 ps |
| $t_{nlp}$ | 200 ps |
| n_td | 2 (minimum) |
| n_nlp | 4 |
| n_dll | 50 |

One skilled in the art should appreciate that clock generator circuit 106 and DLL 108 described herein may be implemented in various ways. In addition, all or many of the aforementioned circuit blocks may be implemented within an integrated circuit (IC) or may also be implemented with a combination of one or more ICs, discrete components, and so on. The same circuit blocks may also be fabricated with various IC process technologies such as complementary metal oxide semiconductor (CMOS).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit (IC) including a non-overlapping clock generation circuit, the non-overlapping clock generation circuit comprising:

a delay lock loop (DLL) circuit having a voltage-controlled delay circuit with a delay time set by a control voltage, and the DLL circuit configured to receive an input clock signal having a given duty cycle and to generate, in response, an extended duty cycle clock signal having an extended duty cycle that varies in accordance with the delay time, and the DLL having circuitry configured to generate the control signal to set the delay time at a value at which the extended duty cycle has a predetermined value greater than the duty cycle of the input clock signal, and a clock generator circuit, configured to receive the control voltage and the input clock signal and to generate, in response, a first set of clock signals and a second set of clock signals delayed from the first set of clock signals by a non-overlapping time ($t_{nlp}$).

2. The IC of claim 1, wherein the clock generator is further configured to generate the first set of clock signals to include a first clock signal (C1) and the second set of clock signals to include a second clock signal (C2), wherein the voltage-controlled delay circuit of the DLL circuit includes a duty cycle control (DCC) circuit having a number (n_dll) of voltage-controlled delay cells, and wherein the clock generator circuit includes a first number (n_td) of voltage-controlled delay cells arranged to delay C1 by a first predetermined amount of time ($t_d$) and output a delayed clock signal (C1d) in the first set of clock signals and includes a second number (n_nlp) of voltage-controlled delay cells arranged to delay C2 by $t_{nlp}$ and output a delayed clock C1d in the second set of clock signals.

3. A wireless communication device comprising:

an analog-to-digital converter having a switched capacitor integrator; and a non-overlapping clock generation circuit controlling the switched capacitor integrator, wherein the non-overlapping clock generation circuit includes a delay lock loop (DLL) circuit having a voltage-controlled delay circuit with a delay time set by a control voltage, and the DLL circuit configured to receive an input clock signal having a given duty cycle and to generate, in response, an extended duty cycle clock signal having an extended duty cycle that varies in accordance with the delay time, and having circuitry configured to generate the control signal to set the delay time at a value at which the extended duty cycle has a predetermined value that is greater than the duty cycle of the input clock signal, and a clock generator circuit, responsive to the control voltage, to generate a first set of clock signals and a second set of clock signals delayed from the first set of clock signals by a non-overlapping time ($t_{nlp}$).

4. The wireless communication device of claim 3, wherein the clock generator is further configured to generate the first set of clock signals to include a first clock signal (C1), and wherein the voltage-controlled delay circuit of the DLL circuit includes a duty cycle control (DCC) circuit having a number (n_dll) of voltage-controlled delay cells, and wherein the clock generator circuit includes a first number (n_td) of voltage-controlled delay cells arranged to delay C1 by a predetermined amount of time ($t_d$) and output a delayed clock signal (C1d) and a second number (n_nlp) of voltage-controlled delay cells arranged to delay C1d by the $t_{nlp}$ and output a second clock signal (C2) of the second set of clock signals.

5. A wireless communication device including at least one analog-to-digital converter utilizing a switched capacitor integrator driven by a non-overlapping clock generation circuit, the non-overlapping clock generation circuit having a clock generator circuit configured to generate non-overlapping delayed clock signals having relative timings based, at least part, on an input clock signal and a control voltage, and a delay lock loop (DLL) circuit configured to generate the control voltage wherein the DLL circuit includes a duty cycle control (DCC) circuit having a number (n_dll) of voltage-controlled delay cells arranged to delay the input clock signal by a delay time set by the control voltage and output a delayed input clock signal, and logic to generate an extended duty cycle clock signal based on the input clock signal and the delayed input clock signal, the extended duty cycle clock having an extended duty cycle based, at least in part, on the delay time, and is configured to generate the control voltage to set the delay time at a value at which the extended duty cycle has a predetermined value that is greater than the duty cycle of the input clock signal, wherein the clock generator circuit is further configured to generate the first set of clock signals to include a first clock signal (C1) and the second set of clock signals, and wherein the clock generate circuit includes a first number (n_td) of voltage-controlled delay cells arranged to receive the control clock voltage and, in response, to delay a first clock signal (C1) of the first set of clock signals by a predetermined amount of time ($t_d$) and output a delayed clock signal (C1d) and includes a second number (n_nlp) of voltage-controlled delay cells arranged to receive the control clock voltage, in response, to delay C1d by the $t_{nlp}$ and output a second clock signal (C2) of the second set of clock signals.

6. A device for generating non-overlapping clock signals comprising:

means for receiving an input clock signal and a control voltage and for generating, in response, a delayed input clock signal, delayed from the input clock signal by a delay time based, at least in part, on the control voltage;

means for generating, based at least in part on the input clock signal and the delayed input clock signal, an extended duty cycle clock signal having an extended duty cycle based, at least in part, on the delay time;

means for generating the control voltage to set the delay time at a value at which the extended duty cycle has a predetermined value that is greater than the duty cycle of the input clock signal;

clock generator means for generating, in response to the control voltage, a first set of clock signals and a second set of clock signals delayed from the first set of clock signals by a non-overlapping time ($t_{nlp}$).

7. The device of claim 6, wherein the clock generator means is further configured to generate the first set of clock signals to include a first clock signal (C1), and wherein the delay loop means includes a number (n_dll) of voltage-controlled delay cells, and wherein the clock generator means includes a first number (n_td) of voltage-controlled delay cells to delay the C1 by a predetermined amount of time ($t_d$), based on the control voltage, and output a delayed clock signal (C1d) and includes a second number (n_nlp) of voltage-controlled delay cells arranged to receive the control clock voltage and, based on the control voltage, to delay C1d by the $t_{nlp}$ and output a second clock signal (C2) of the second set of clock signals.

8. The device of claim 7, wherein a ratio between the n_dll and n_td is defined as $$\frac{\text{n\_dll}}{\text{n\_td}} = \frac{Ts}{t_d} \cdot (duty_{out} - duty_{in})$$

where $duty_{in}$ is the duty cycle of the input clock signal; $duty_{out}$ is the extended duty cycle of the extended duty cycle clock signal and Ts is a duration of time from a rising edge of the C1 to the next rising edge of the C1.

9. The device of claim 7, wherein a ratio between the n_dll and the n_nlp is defined as $$\frac{\text{n\_dll}}{\text{n\_nlp}} = \frac{Ts}{t_{nlp}} \cdot (duty_{out} - duty_{in})$$

where $t_{nlp}$ is the non-overlap time corresponding to a falling edge of the C1d to a rising edge of the C2; $duty_{in}$ is the duty cycle of the input clock signal; $duty_{out}$ is the extended duty cycle of the extended duty cycle clock signal; and Ts is a duration of time from a rising edge of the C1 to a falling edge of a second delayed clock signal (C2d) delayed from the C2 of the second set of clock signals.

10. A method of generating non-overlapping clock signals comprising:
receiving an input clock signal having a given duty cycle;
delaying the input clock signal by a delay time based, at least in part, on a control voltage, and generating a corresponding delayed input clock signal;
generating, based at least in part on the input clock signal and the delayed input clock signal, an extended duty cycle clock signal having an extended duty cycle based, at least in part, on the delay time, wherein the generating includes generating the control voltage to set the delay time at a value at which the extended duty cycle has a predetermined value that is greater than the duty cycle of the input clock;
and
generating, based at least in part on the input clock signal and the control voltage, a first set of clock signals and a second set of clock signals delayed from the first set of clock signals by a non-overlapping time ($t_{nlp}$).

11. The method of claim 10, wherein the first set of clock signals includes a first clock signal (C1), and
wherein the delaying the input clock signal is by transmitting the input clock signal through a number (n_dll) of voltage-controlled delay cells and controlling said voltage-controlled delay cells with the control voltage, and wherein the generating the second set of clock signals includes delaying the C1 through a first number (n_td) of voltage-controlled delay cells by a first predetermined amount of time ($t_d$) to output a delayed clock signal (C1d) and delaying C1d through a second number (n_nlp) of voltage-controlled delay cells by the $t_{nlp}$ to output a second clock signal (C2) of the second set of clock signals.

12. The method of claim 11, wherein a ratio between the n_dll and n_td is defined as $$\frac{\text{n\_dll}}{\text{n\_td}} = \frac{Ts}{t_d} \cdot (duty_{out} - duty_{in})$$

where $duty_{in}$ is the duty cycle of the input clock signal; $duty_{out}$ is the extended duty cycle of the extended duty cycle clock signal; and Ts is a duration of time from a rising edge of the C1 to the next rising edge of the C1.

13. The method of claim 11, wherein a ratio between the n_dll and the n_nlp is defined as $$\frac{\text{n\_dll}}{\text{n\_nlp}} = \frac{Ts}{t_{nlp}} \cdot (duty_{out} - duty_{in})$$

where $t_{nlp}$ is the non-overlap time corresponding to a falling edge of the C1d to a rising edge of the C2; $duty_{in}$ is the duty cycle of the input clock signal; $duty_{out}$ is the extended duty cycle of the extended duty cycle clock signal; and Ts is a duration of time from a rising edge of the C1 to a falling edge of a second delayed clock signal (C2d) delayed from the C2 of the second set of clock signals.

14. A non-transitory computer program product having instructions for causing a wireless communication device to generate non-overlapping clock signals, the non-transitory computer program product including instructions to cause the wireless communication device to:
receive an input clock signal having a given duty cycle;
delay the input clock signal by a delay time based, at least in part, on a control voltage, and generate a corresponding delayed input clock signal;
and
generate, based at least in part on the input clock signal and the delayed input clock signal, an extended duty cycle clock signal having an extended duty cycle based, at least in part, on the delay time, and to include, in generating the extended duty cycle clock signal, generating the control voltage to set the delay time at a value at which the extended duty cycle has a predetermined value that is greater than the duty cycle of the input clock;
and
generate, in response to the control voltage, a first set of clock signals and a second set of clock signals delayed from the first set of clock signals by a non-overlapping time ($t_{nlp}$).

15. The non-transitory computer program of claim 14, wherein the wireless communication device is characterized by a number (n_dll) of voltage-controlled delay cells, the instruction to generate includes causing a first number (n_td) of voltage-controlled delay cells to delay a first clock signal (C1) of the first set of clock signals by a first predetermined amount of time ($t_d$) to form a delayed clock signal (C1d) and to delay C1d through a second number (n_nlp) of voltage-controlled delay cells by the $t_{nlp}$ to form a second clock signal (C2) of the second set of clock signals.

16. The non-transitory computer program of claim 15, wherein a ratio between the n_dll and n_td is defined as $$\frac{\text{n\_dll}}{\text{n\_td}} = \frac{Ts}{t_d} \cdot (duty_{out} - duty_{in})$$

where $duty_{in}$ is the duty cycle of the input clock signal; $duty_{out}$ is the extended duty cycle of the extended duty cycle clock signal; and Ts is a duration of time from a rising edge of the C1 to the next rising edge of the C1.

17. The non-transitory computer program of claim 15, wherein a ratio between the n_dll and the n_nlp is defined as $$\frac{\text{n\_dll}}{\text{n\_nlp}} = \frac{Ts}{t_{nlp}} \cdot (duty_{out} - duty_{in})$$

where $t_{nlp}$ is the non-overlap time corresponding to a falling edge of the C1$d$ to a rising edge of the C2; $duty_{in}$ is the duty cycle of the input clock signal; $duty_{out}$ is the extended duty cycle of the extended duty cycle clock signal; and Ts is a duration of time from a rising edge of the C1 to a falling edge of a second delayed clock signal (C2$d$) delayed from the C2 of the second set of clock signals.

18. The IC of claim 2, wherein a ratio between the n_dll and n_td is defined as $$\frac{\text{n\_dll}}{\text{n\_td}} = \frac{Ts}{t_d} \cdot (duty_{out} - duty_{in})$$

where $duty_{in}$ is the duty cycle of the input clock signal;

$duty_{out}$ is the extended duty cycle of the extended duty cycle clock signal; and Ts is the period of the input clock signal.

19. The IC of claim 2, wherein a ratio between the n_dll and the n_nlp is defined as $$\frac{\text{n\_dll}}{\text{n\_nlp}} = \frac{Ts}{t_{nlp}} \cdot (duty_{out} - duty_{in})$$

where $t_{nlp}$ is the non-overlap time corresponding to a falling edge of the C1$d$ to a rising edge of the C2;

$duty_{in}$ is the duty cycle of the input clock signal;

$duty_{out}$ is the extended duty cycle of the extended duty cycle clock signal; and Ts is the period of the input clock signal.

* * * * *